United States Patent
Yang et al.

(10) Patent No.: US 8,610,276 B2
(45) Date of Patent: Dec. 17, 2013

(54) METAL CAP FOR BACK END OF LINE (BEOL) INTERCONNECTS, DESIGN STRUCTURE AND METHOD OF MANUFACTURE

(75) Inventors: Chih-Chao Yang, Glenmont, NY (US); Kaushik Chanda, Fishkill, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/474,916

(22) Filed: May 18, 2012

(65) Prior Publication Data
US 2012/0228770 A1    Sep. 13, 2012

Related U.S. Application Data

(62) Division of application No. 13/418,659, filed on Mar. 13, 2012, which is a division of application No. 12/191,522, filed on Aug. 14, 2008, now Pat. No. 8,232,645.

(51) Int. Cl.
*H01L 23/48*    (2006.01)

(52) U.S. Cl.
USPC .... 257/751; 257/758; 257/762; 257/E23.141; 257/E23.169; 716/100; 326/27

(58) Field of Classification Search
USPC .......... 257/751, 758, 762, E23.141, E23.169; 716/100; 326/27
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,323,554 B1 | 11/2001 | Joshi et al. | |
| 6,342,733 B1 | 1/2002 | Hu et al. | |
| 6,706,625 B1 | 3/2004 | Sudijono et al. | |
| 6,975,032 B2 | 12/2005 | Chen et al. | |
| 7,198,662 B2 | 4/2007 | Marumo | |
| 7,511,530 B1 * | 3/2009 | Cox et al. | 326/30 |
| 7,745,282 B2 | 6/2010 | Yang et al. | |
| 2004/0113279 A1 | 6/2004 | Chen et al. | |
| 2005/0263891 A1 | 12/2005 | Lee et al. | |
| 2006/0113675 A1 | 6/2006 | Chang et al. | |

(Continued)

OTHER PUBLICATIONS

Notice of Allowance for Parent U.S. Appl. No. 12/191,522 dated Apr. 5, 2012.

(Continued)

*Primary Examiner* — Andy Huynh
(74) *Attorney, Agent, or Firm* — Katherine S. Brown; Roberts Mlotkowski Safran & Cole, P.C.

(57) ABSTRACT

A structure is provided with a metal cap for back end of line (BEOL) interconnects that substantially eliminates electromigration (EM) damage, a design structure and a method of manufacturing the IC. The structure includes a metal interconnect formed in a dielectric material and a metal cap selective to the metal interconnect. The metal cap includes RuX, where X is at Boron, Phosphorous or a combination of Boron and Phosphorous.

11 Claims, 5 Drawing Sheets

(56) References Cited

U.S. PATENT DOCUMENTS

| | | |
|---|---|---|
| 2007/0018332 A1 | 1/2007 | Ueno |
| 2008/0197499 A1 | 8/2008 | Yang et al. |
| 2008/0315426 A1 | 12/2008 | Yang et al. |
| 2009/0200668 A1 | 8/2009 | Yang et al. |
| 2009/0218691 A1 | 9/2009 | Yang et al. |
| 2010/0038782 A1 | 2/2010 | Yang et al. |
| 2010/0252929 A1 | 10/2010 | Budrevich et al. |

OTHER PUBLICATIONS

Office Action for related U.S. Appl. No. 13/418,659 dated Oct. 23, 2012.

Final Office Action for related U.S. Appl. No. 13/418,659 dated Mar. 11, 2013.

Notice of Allowance for related U.S. Appl. No. 13/418,659 dated Jun. 12, 2013.

* cited by examiner

METAL CAP FOR BACK END OF LINE (BEOL) INTERCONNECTS, DESIGN STRUCTURE AND METHOD OF MANUFACTURE

CROSS REFERENCE TO RELATED APPLICATIONS

The present application is a divisional application of co-pending U.S. application Ser. No. 13/418,659, filed on Mar. 13, 2012, which is a divisional application of co-pending U.S. application Ser. No. 12/191,522, filed on Aug. 14, 2008, the contents of which are incorporated by reference in its entirety herein.

FIELD OF THE INVENTION

The present invention relates to integrated circuits (ICs), a design structure and a method of manufacturing the IC and, more particularly, to a cap for back end of line (BEOL) interconnects that substantially eliminates electro-migration (EM) damage, a design structure and a method of manufacturing the IC.

BACKGROUND

Electromigration is the transport of material caused by the gradual movement of ions in a conductor due to the momentum transfer between conducting electrons and diffusing metal atoms. The effect of electromigration is an important consideration to take into account in applications where high direct current densities are used, such as in microelectronics and related structures. In fact, electromigration is known to decrease the reliability of integrated circuits (ICs) and hence lead to a malfunction of the circuit. In the worst case, for example, electromigration leads to the eventual loss of one or more connections and intermittent failure of the entire circuit.

The effect of electromigration becomes an increasing concern as the size of the IC decreases. That is, as the structure size in ICs decreases, the practical significance of this effect increases. Thus, with increasing miniaturization the probability of failure due to electromigration increases in VLSI and ULSI circuits because both the power density and the current density increase.

Back-end-of-line (BEOL) interconnects, consisting of metal wires and inter-level vias, carry high direct current (DC) in advanced integrated circuit (IC) chip technology. In particular, as IC chip technology advances, the current density required in these metal wires/vias increases with the ever-decreasing dimensions in IC chip technology. Also, self-heating by high current devices raises the temperature of nearby interconnects under circuit operation and makes use of high current carrying BEOL interconnects extremely challenging. For example, a device that uses high current and self-heats (e.g., a resistor, a bipolar transistor, etc.) may heat up an interconnect wire that couples to the device. The high current leads to electro-migration (EM) degradation of the interconnect (via and/or line), causing shorts or opens.

As a result, the current-carrying capability (or the $I_{dc}$ limit specified in the design manuals) is significantly reduced to avoid electro-migration degradation in interconnects. As an example, a direct current limit in a copper interconnect may be reduced by a factor of more than three resulting from a temperature rise of about 15° C. from, for example, 85° C. to 100° C., and by almost a factor of 20 at a 125° C. interconnect temperature. As a result, high direct current at elevated temperatures is almost impossible with conventional interconnect structures.

There are various methods aimed at addressing this reliability issue in metal wires/vias. Known methods, though, result in EM induced voids occurring in any section of the segment, which will cause the wire to eventually open as the void grows in size. Other methods use liners to enclose vias. However, such structures and methods do not provide any means to protect EM damage in metal wires, nor do such structures address the EM damage at the via/wire interface.

Accordingly, there exists a need in the art to overcome the deficiencies and limitations described hereinabove.

SUMMARY

In a first aspect of the invention, a structure comprises a metal interconnect formed in a dielectric material and a metal cap selective to the metal interconnect. The metal cap comprising RuX, where X is at least one of Boron and Phosphorous.

In another aspect of the invention, a method of fabricating an interconnect structure comprises forming an interconnect in an insulation material. The method further comprises selectively depositing a metal cap material on the interconnect. The metal cap material comprises RuX, where X is at least one of Boron and Phosphorous.

In yet a still further aspect of the invention, a design structure is embodied in a machine-readable medium for designing, manufacturing, or testing an integrated circuit. The design structure comprises a metal interconnect formed in a dielectric material and a metal cap selective to the metal interconnect, the metal cap comprising RuX, where X is at least one of Boron and Phosphorous.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to integrated circuits (ICs), a design structure and a method of manufacturing the IC and, more particularly, to a metal cap for back end of line (BEOL) interconnects that substantially eliminates electro-migration (EM) damage, a design structure and a method of manufacturing the IC. In implementation, the present invention provides a metal cap design to overcome EM induced damage, which includes a metal cap layer that is selective to the metal interconnect. The metal cap layer serves as an EM blocking layer.

Figure 1:
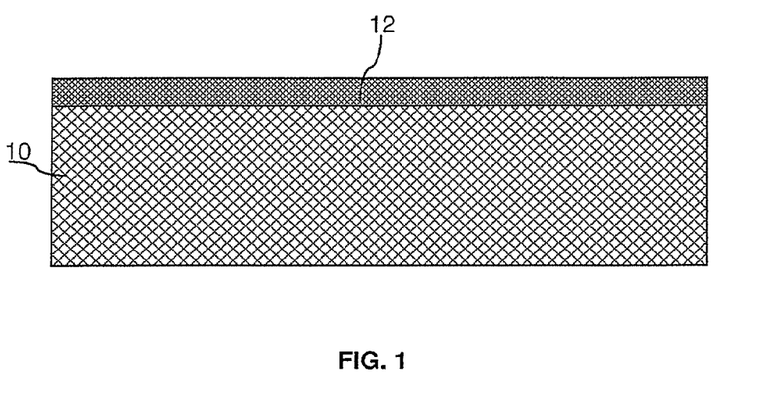
FIGS. 1-4 show fabrication processes and respective structures for manufacturing a structure in accordance with the present invention.

FIG. 1 shows a beginning structure in accordance with the invention. The beginning structure includes a sacrificial dielectric layer 12 deposited on a dielectric layer 10. The sacrificial dielectric layer 12 may be, for example, SiO$_2$. The sacrificial dielectric layer 12 may be deposited in any conventional manner such as, for example, a spin on process or chemical vapor deposition (CVD) process. The low k dielectric layer 10 may be SiCOH, as one non-limiting example. The low k dielectric layer 10 may be either porous or dense, and may be applied by a spin on process or CVD process.

Figure 2:
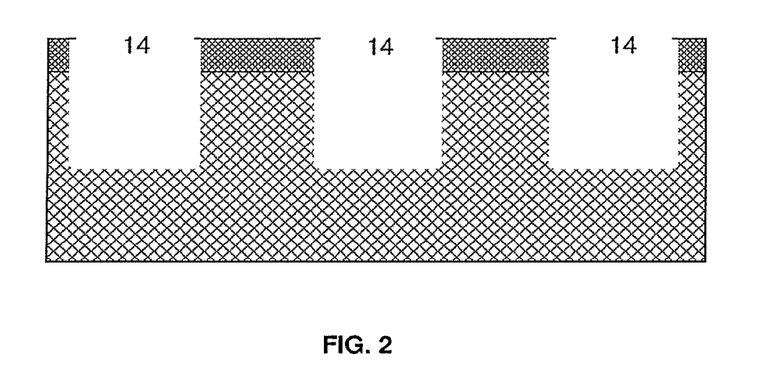

In FIG. 2, trenches 14 are processed in the low k dielectric layer 10 and the sacrificial dielectric layer 12. The trenches 14 may be formed using any conventional lithography and etching process. For example, a mask (not shown) may be applied over the sacrificial dielectric layer 12 and exposed to light to form openings. A reactive ion etching (RIE) may then be performed to form the trenches 14.

Figure 3:
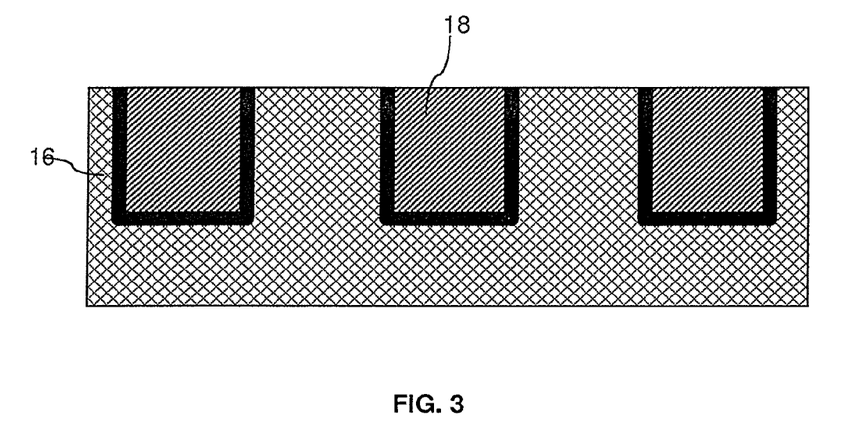

FIG. 3 shows post metallization and chemical mechanical polishing (CMP) processes. More specifically, in FIG. 3 a liner 16 is deposited in the trenches. The liner 16 may be a barrier layer of TiN, TaN, WN, RuTa(N) or RuN, for example. The deposition process may be a conventional deposition process such as, for example, CVD, physical vapor deposition (PVD) or atomic layer deposition (ALD). In embodiments, the liner 16 can have a thickness of about 20 Å to 200 Å. An interconnect 18 such as, for example, Cu or Cu(Al) is deposited over the liner 18. The structure is then planarized using, for example, CMP processes.

Figure 4:
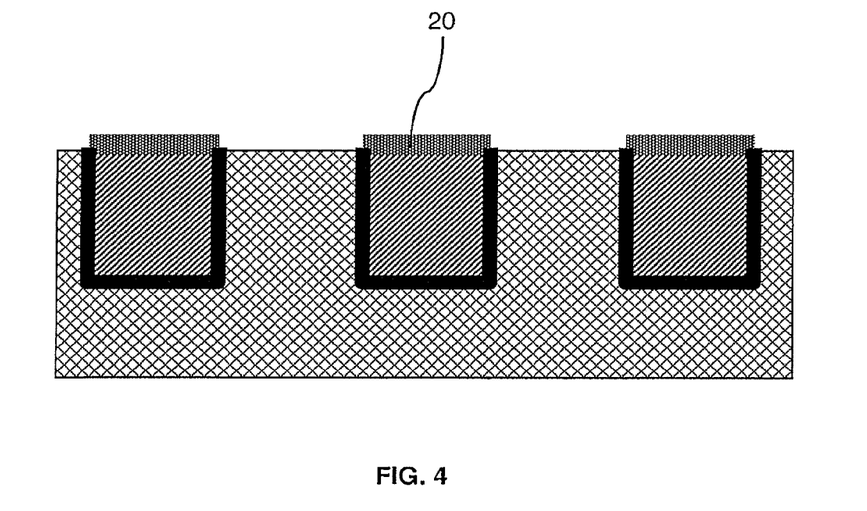

In FIG. 4, a metal cap 20 is selectively deposited on the interconnect 18. More specifically, the metal cap 20 is selective to metal, e.g., the interconnect 18, such that the metal cap 20 is not deposited on the low k dielectric layer 10. In embodiments, the metal cap 20 is Ru(P), Ru(B) or Ru(P,B). It should be understood by those of skill in the art that the use of Ru alone is not a good oxygen diffusion barrier. As such, the copper surface of the interconnect 18 may oxidize which has a negative impact on EM resistance. However, it has been found that using Ru(P), Ru(B) or Ru(P,B) is a superior oxygen diffusion barrier which does not allow the interconnect surface to oxidize. Accordingly, the metal cap of Ru(P), Ru(B) or Ru(P,B) will prevent EM issues.

Figure 5A:
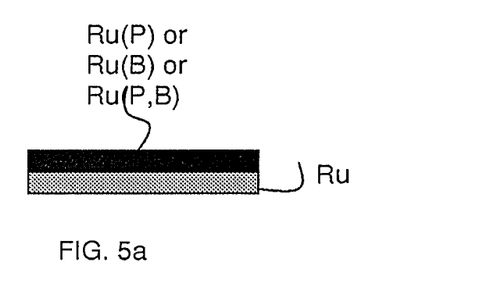
FIGS. 5a-5d shows different metal capping layer variants according to aspects of the invention.

FIGS. 5a-5d show different variants of Ru(P), Ru(B) or Ru(P,B) as contemplated by the invention. For example, as shown in FIG. 5a, in aspects of the invention, the metal cap comprises a bottom layer of Ru and an upper layer of Ru(P), Ru(B) or Ru(P,B). In embodiments, the Ru layer and the layer of Ru(P), Ru(B) or Ru(P,B) are each about 20 Å or less and can range from about 10 Å to 20 Å. In further embodiments, the percent concentration of (P), (B) or (P)(B) ranges from about 2% to 30%.

Figure 5B:
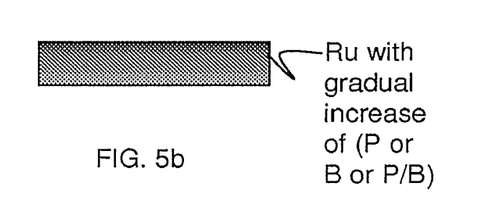

FIG. 5b shows a further aspect of the invention, where the metal cap is a layer of Ru(P), Ru(B) or Ru(P,B), with the (P), (B) or (P)(B) component gradually increasing in percentage concentration as it is deposited on the interconnect 18. For example, in implementation, the (P), (B) or (P)(B) can be introduced during the deposition process by increasing the gas flow of (P), (B) or (P)(B) such that the bottom portion of the metal cap is, for example, 0% of (P), (B) or (P)(B) and the upper portion is, for example, about 30% of (P), (B) or (P)(B), with a gradual increase therebetween. The concentration of (P), (B) or (P)(B) can be increased or decreased by adjusting the gas flow.

Figure 5C:
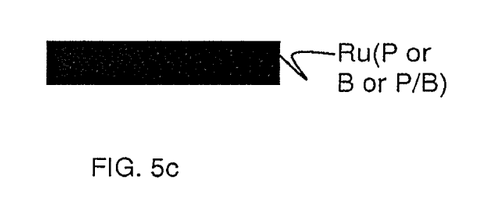

FIG. 5c shows a further aspect of the invention, where the metal cap is a single layer of Ru(P), Ru(B) or Ru(P,B), with the (P), (B) or (P)(B) component having a substantially constant percentage concentration throughout the entire metal cap. For example, in implementation, the percentage concentration of (P), (B) or (P)(B) can range from about 2% to 30%, in relation to the entire structure.

Figure 5D:
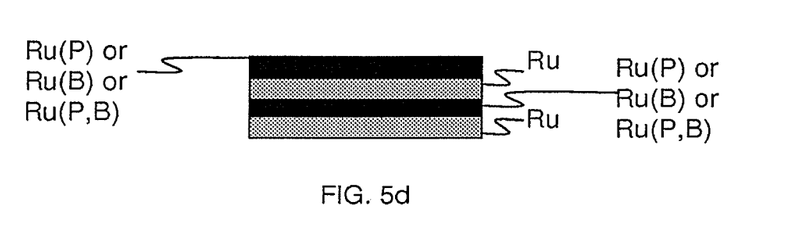

FIG. 5d shows a further aspect of the invention, where the metal cap is a layered structure. For example, in one aspect, the layers may alternate between (i) Ru and Ru(P), (ii) Ru and Ru(B), (iii) Ru and Ru(P,B). In embodiments, the percentage concentration of (P), (B) or (P)(B) can range from about 0% to 30%, in relation to the entire layered structure. The thickness of the metal cap can be about 30 Å to 50 Å, with each layer ranging from about less than 10 Å and preferably about 1 Å to 2 Å.

Figure 6:
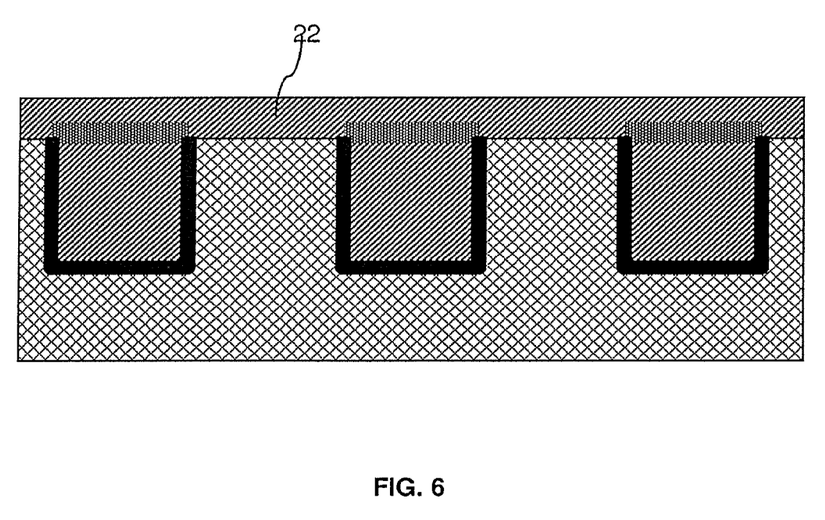
FIG. 6 shows fabrication processes and a final structure in accordance with the present invention.

FIG. 6 shows a final structure and respective processing steps in accordance with an aspect of the invention. As shown in FIG. 6, a dielectric cap 22 is deposited on the structure of FIG. 4. The dielectric cap 22 can be, for example, Si$_3$N$_4$, SiC, SiC(N,H) etc. The dielectric cap 22 can be deposited via a CVD deposition technique.

Design Structure

Figure 7:
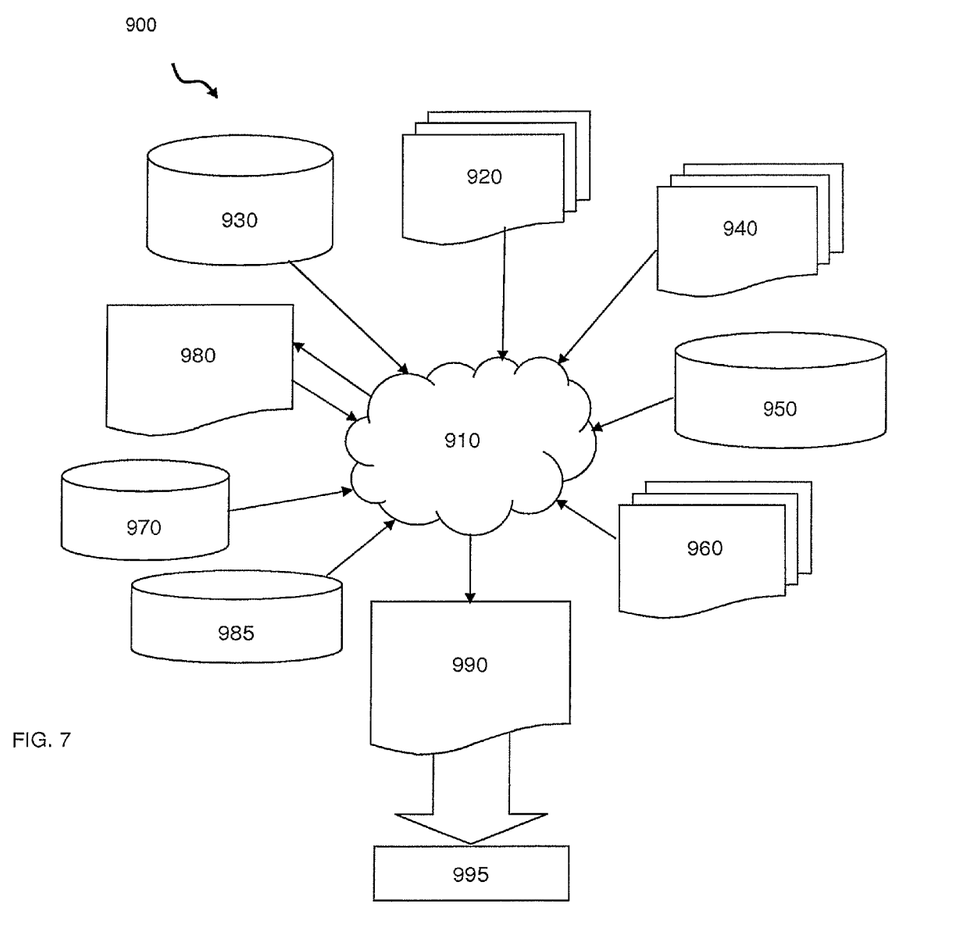
FIG. 7 is a flow diagram of a design process used in semiconductor design, manufacture, and/or test.

FIG. 7 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 4 and 6. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 4 and 6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 4 and 6 to generate a netlist 980 which may contain design structures such as design structure 920.

Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4 and 6. In one embodiment, design structure 990 may comprise a compiled, executable HDL simulation model that functionally simulates the devices shown in FIGS. 4 and 6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 4 and 6. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A design structure embodied in a computer readable medium comprising computer executable instructions for designing, manufacturing, or testing an integrated circuit, the design structure comprising a metal interconnect formed in a dielectric material and a metal cap selective to the metal interconnect, the metal cap comprising RuX, where X is at least one of Boron and Phosphorous, wherein the metal interconnect is planar with a surface of the dielectric material, and wherein the metal cap consists essentially of a bottom layer of Ru and a top layer of Ru(P), Ru(B) or Ru(P, B).

2. The design structure of claim 1, wherein the design structure is tangibly embodied in the machine readable medium.

3. The design structure of claim 1, wherein the design structure comprises a netlist.

4. The design structure of claim 1, wherein the design structure resides on storage medium as a data format used for the exchange of layout data of integrated circuits.

5. The design structure of claim 1, wherein the design structure resides in a programmable gate array.

6. The design structure of claim 1, wherein the metal cap is formed in a layered structure by applying alternating layers of (i) Ru and Ru(P), (ii) Ru and Ru(B), or (iii) Ru and Ru(P,B).

7. A design structure embodied in a computer readable medium comprising computer executable instructions for designing, manufacturing, or testing an integrated circuit, the design structure comprising a metal interconnect formed in a dielectric material and a metal cap selective to the metal interconnect, the metal cap comprising RuX, where X is at least one of Boron and Phosphorous, wherein the metal interconnect is planar with a surface of the dielectric material, wherein the metal cap comprises a mixture of Ru with a component of (P), (B) or (P, B), with the component of (P), (B) or (P, B) gradually increasing in percentage concentration as it is deposited on the interconnect.

8. The design structure of claim 7, wherein a bottom portion of the metal cap is about 0% of (P), (B) or (P)(B) and an upper portion is about 30% of (P), (B) or (P)(B), with a gradual increase therebetween.

9. A design structure embodied in a computer readable medium comprising computer executable instructions for designing, manufacturing, or testing an integrated circuit, the design structure comprising a metal interconnect formed in a dielectric material and a metal cap selective to the metal interconnect, the metal cap comprising RuX, where X is at least one of Boron and Phosphorous, wherein the metal interconnect is planar with a surface of the dielectric material, wherein the metal cap comprises a single layer of Ru(P), Ru(B) or Ru(P,B), with (P), (B) or (P,B) having a substantially constant percentage concentration throughout the metal cap.

10. A design structure embodied in a computer readable medium comprising computer executable instructions for designing, manufacturing, or testing an integrated circuit, the design structure comprising a metal interconnect formed in a dielectric material and a metal cap selective to the metal interconnect, the metal cap comprising RuX, where X is at least one of Boron and Phosphorous, wherein the metal interconnect is planar with a surface of the dielectric material, wherein the metal cap is formed in a layered structure by applying alternating layers of (i) Ru and Ru(P), (ii) Ru and Ru(B), or (iii) Ru and Ru(P,B).

11. A design structure embodied in a computer readable medium comprising computer executable instructions for designing, manufacturing, or testing an integrated circuit, the design structure comprising a metal interconnect formed in a dielectric material and a metal cap selective to the metal interconnect, the metal cap comprising RuX, where X is at least one of Boron and Phosphorous, wherein the metal interconnect is planar with a surface of the dielectric material, wherein the metal cap is deposited to a thickness of less than 50 Å.

* * * * *